(12) United States Patent
Le Roy et al.

(10) Patent No.: US 6,955,930 B2
(45) Date of Patent: Oct. 18, 2005

(54) METHOD FOR DETERMINING THICKNESS OF A SEMICONDUCTOR SUBSTRATE AT THE FLOOR OF A TRENCH

(75) Inventors: Erwan Le Roy, San Jose, CA (US); Chun-Cheng Tsao, Cupertino, CA (US)

(73) Assignee: Credence Systems Corporation, Milpitas, CA (US)

( * ) Notice: Subject to any disclaimer, the term of this patent is extended or adjusted under 35 U.S.C. 154(b) by 16 days.

(21) Appl. No.: 10/161,272

(22) Filed: May 30, 2002

(65) Prior Publication Data

US 2003/0224543 A1 Dec. 4, 2003

(51) Int. Cl.[7] .............................................. H01L 21/66
(52) U.S. Cl. ............................ 438/16; 438/14; 438/16; 438/17; 438/18
(58) Field of Search .............................. 438/4, 7, 9–14, 438/16–18, 424

(56) References Cited

U.S. PATENT DOCUMENTS

| | | | |
|---|---|---|---|
| 5,140,164 A | 8/1992 | Talbot et al. | 250/492.2 |
| 5,840,630 A | 11/1998 | Ceccere et al. | 438/712 |
| 6,031,229 A | 2/2000 | Keckley et al. | 250/309 |
| 6,225,626 B1 | 5/2001 | Talbot et al. | 250/307 |
| 6,337,540 B1 * | 1/2002 | Corbin et al. | |
| 6,372,627 B1 * | 4/2002 | Ring et al. | |
| 6,464,842 B1 * | 10/2002 | Golovchenko et al. | |
| 6,545,490 B1 * | 4/2003 | Bruce | |
| 6,548,312 B1 * | 4/2003 | Hayano et al. | |
| 6,559,942 B2 * | 5/2003 | Sui et al. | |
| 2002/0074494 A1 * | 6/2002 | Lundquist et al. | |

* cited by examiner

Primary Examiner—John F. Niebling
Assistant Examiner—Stanetta Isaac
(74) Attorney, Agent, or Firm—Deborah W. Winocur (57) ABSTRACT

Apparatus and method for exposing a selected feature of an integrated circuit device such as a selected portion of the metallization layer, from the backside of the integrated circuit substrate without disturbing adjacent features of the device such as the active semiconductor regions. This is performed using an FIB (focused ion beam) etching process in conjunction with observation by an optical microscope to form a trench through the substrate. The process includes a precise optical endpointing technique to monitor the remaining thickness of the semiconductor substrate at the floor of the trench. It is important to terminate etching of the trench so that the trench floor extends as close to the active semiconductor structures as desired and yet is not detrimental to device operation. This is done without introducing a need for any additional tool. This is carried out using an infra-red optical technique which observes the interference fringes generated by the reflections from the silicon substrate surface and from semiconductor device circuitry layers to quantify the remaining semiconductor substrate thickness in the trench.

6 Claims, 13 Drawing Sheets

METHOD FOR DETERMINING THICKNESS OF A SEMICONDUCTOR SUBSTRATE AT THE FLOOR OF A TRENCH

FIELD OF THE INVENTION

This disclosure pertains to semiconductor technology and more specifically to forming a trench through a semiconductor substrate of an integrated circuit so as to access, from the backside of the substrate, interconnection metal layers formed on the opposing principal surface of the substrate, the trenching process using a focused ion beam.

DESCRIPTION OF RELATED ART

It is well known to use a focused ion beam (FIB) for exposing circuitry on an integrated circuit (IC) to aid in debug, or failure analysis, and repair of the integrated circuit. See for instance U.S. Pat. No. 6,225,626, issued May 1, 2001, to Talbot et al.; U.S. Pat. No. 5,140,164, issued Aug. 18, 1992 to Talbot et al.; and U.S. Pat. No. 5,616,921, issued Apr. 1, 1997 to Talbot et al., all incorporated herein by reference in their entireties. U.S. Pat. No. 6,225,626 discloses methods for exposing a selected feature of an IC such as a selective conductor, from the backside of the IC substrate without disturbing adjacent features of the device, such as the active (semiconductor) regions. The method includes determining a region of the IC in which the selected feature is located; obtaining from the backside of the IC substrate an IR (infra-red) optical microscope image of the region; aligning the IR optical microscope image with a coordinate system of a milling (FIB) system; and using structures visible in the IR microscope image as a guide, operating the milling system to expose the selected feature from the backside of the IC without disturbing adjacent features.

Other aspects of this approach include forming the trench (typically 100×100 to 500×500 microns and in the case of laser chemically etched trenches up to 2×2 mm) through the backside of the substrate where the trench is stepped in cross-section and milling (etching) down through the substrate from the backside surface thereof to within a few microns of the circuitry layers. The focused ion beam is then used to cut an access hole to certain metal traces in order to reconnect or cut so as to reroute the circuit and thus perform a circuit edit. This is used typically for failure analysis, debug, and repair (rework) of ICs. It is most typically used in the research and development and manufacturing engineering stages. Schlumberger Technologies Inc., assignee of this application and of the above referenced patents, produces commercially available FIB systems, such as the IDS P2X and IDS P3X systems as well as the IDS OptiFIB instrument. This latter instrument includes the focused ion beam coaxial with an optical microscope for light optical imaging through silicon, especially with infra-red, and for the observation of the milling process.

It has been recognized by the present inventors that prior to performing circuit editing (cutting and/or filling in of the metal layers), the trench itself which is formed through the backside surface of the silicon substrate must be etched precisely. It has been determined also by the present inventors that in order for this thin remaining layer of silicon substrate to be suitable for the circuit edit, it is preferred that its thickness be precisely determined. Since this silicon layer is the floor of the trench formed from the backside surface of the substrate, the present inventors have determined that it is preferred that the floor of the trench be nearly perfectly flat and/or exactly parallel in terms of its planarity with the circuitry such as the diffusion or active layer of the IC.

It is known in the field that uncertain die thickness and unintentional wedging and bowing, during pre-thinning for instance, contribute to the uncertainty of the remaining thickness of the floor of the trench relative to the active portions (doped regions) of the integrated circuit. Hence it is a known problem to determine the remaining thickness of the floor of the substrate.

One known method provided by Revise Inc. of Burlington, Mass. is referred to as the "OBIC end pointing process" (see U.S. Pat. No. 6,069,366) and permits etching of the trench floor very close (5 to 10 micrometers) to the semiconductor diffusions without need for accurate knowledge of the substrate thickness, wedging or bowing. Note that the wedging or bowing are well known imperfections in semiconductor substrates. In OBIC the end pointing process generates a control signal electrical current which rises exponentially as the active diffusions (regions) are approached during etching of the trench. The source of this current is diffusion of electrons generated by absorption of an intense laser radiation incident on the bottom of the trench during the etching. Using this current detection approach, the etching can be stopped with high accuracy at the desired 5 to 10 micrometers ($\mu$m) distance from the integrated circuit semiconductor diffusions.

It is believed by Revise that the OBIC process performs well. However OBIC requires providing a laser beam incident on the bottom of the trench and which results in the induced current. Additionally, the OBIC approach requires electrical connection of the IC under trenching and therefore needs electrical feedthroughs for the inherent vacuum requirement of a FIB system. Hence this is an additional complication and expense for the already rather complex FIB tool.

Hence the present inventors have determined that it would be advantageous to be able to measure the thickness of the floor of the trench in the substrate without provision of the laser and electrical feedthroughs required by the OBIC end pointing process.

SUMMARY

As described above in connection with the OBIC end pointing process, stopping etching of the trench at a known floor thickness of the semiconductor substrate has been challenging.

The present inventors have found that it is possible to provide an optical end pointing technique (but without use of a laser) using an infra-red optical imaging system and detection of the resulting reflected infra-red light using the interference fringe patterns to quantify the remaining silicon (or other substrate material) thickness at the trench floor. The infra-red (or other suitable light) reflects from the trench floor and also reflects from the interface of the circuitry layers. These dual reflections result in interference fringes. As the remaining substrate thickness at the floor of the trench gets thinner due to progressive trench etching, it is possible to observe eau interference fringes, which when analyzed quantify the remaining substrate thickness with a precision of less than one $\mu$m for instance.

Advantageously of course there is no need for the laser source required by the OBIC process. Hence a simpler and easier to use tool is provided in, e.g., the IDS OptiFIB which is already equipped with infrared optical system capability and accompanying infra-red light source which can be used for the present end pointing process. The present process depends on the fact that the transmissivity of silicon which is doped, as in semiconductor devices, is primarily a function of remaining silicon thickness. The higher the tranmissivity the stronger the interference, therefore the larger the fringe contrast. Interference happens when light reflected off the silicon surface (trench floor) overlaps with light reflected off the circuitry layer. The circuitry layer is complex in terms of material—diffusions, oxide and some less contribution from the poly-silicon and metallizations. It has been found that observations of interference fringes may depend on a relative contrast of the fringes.

It is to be understood that this process is not limited to the typical silicon integrated circuit substrates but also applies to other crystalline substrates used in semiconductors; of course the particular injected FIB gases and FIB ions disclosed here and the accompanying FIB parameters are merely exemplary.

The associated apparatus includes an FIB tool in combination with an optical microscope and suitable controls.

DETAILED DESCRIPTION

Figure 13A:
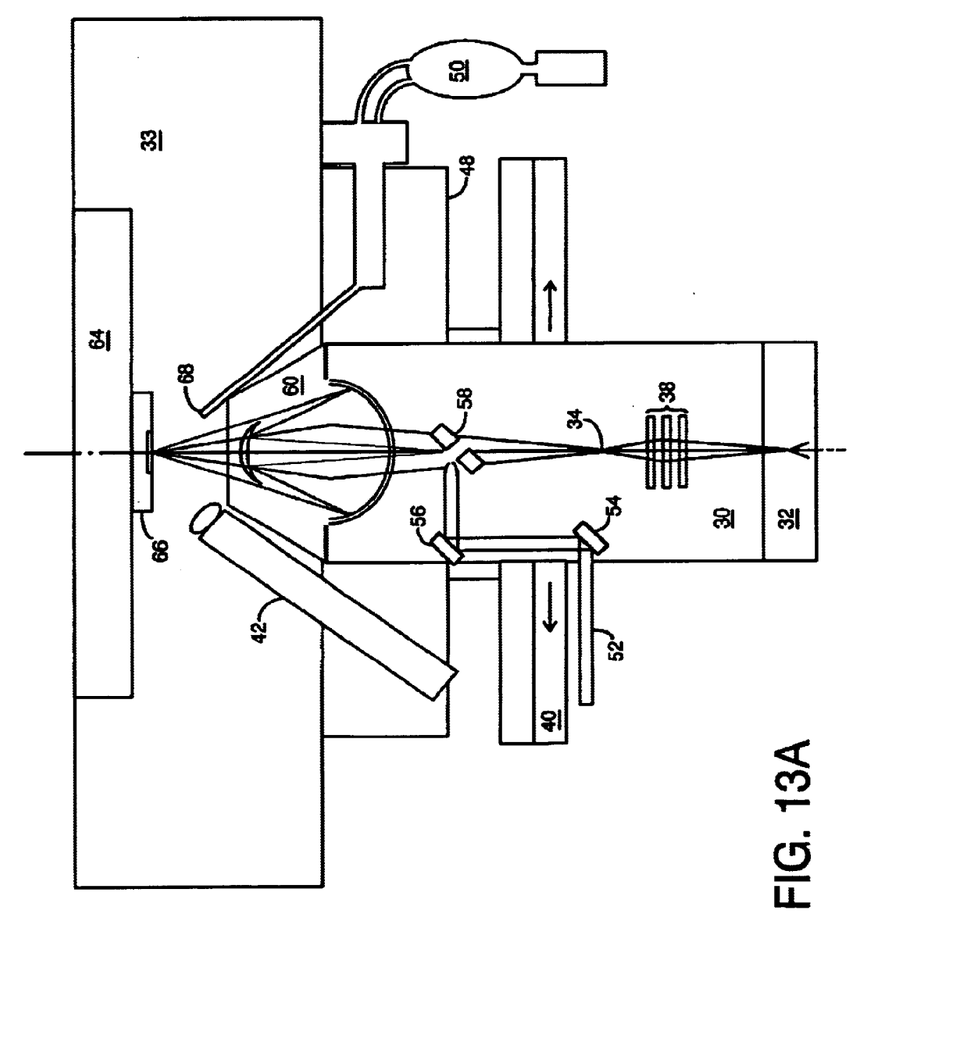
FIGS. 13A, 13B show an apparatus useful in accordance with practicing the method of this disclosure.
Figure 13B:
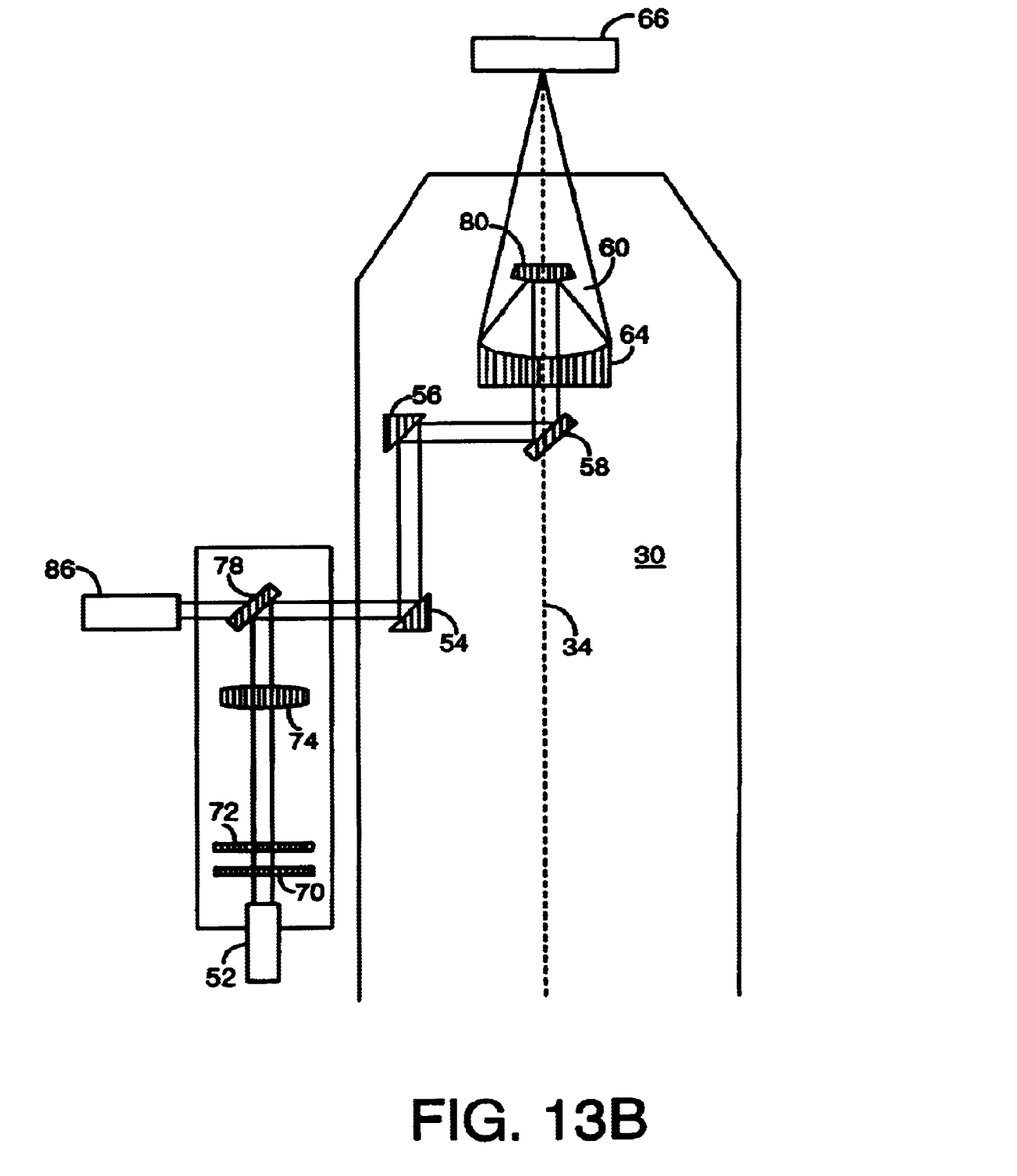

For detail of an FIB apparatus system useful in accordance with this disclosure, see, e.g., U.S. Pat. No. 6,225,626. Conventional detail of this apparatus and the accompanying well known FIB techniques for forming trenches is not included herein except as shown in FIGS. 13A, 13B. Briefly, however, the FIB tool (apparatus) includes a source of ions, gallium ions in one example, the FIB column which accelerates and focuses the ion beams onto the workpiece, a conventional apparatus for injecting the chemistry gas onto the FIB impact area of the workpiece under controlled circumstances to enhance the FIB etching, an X-Y movable stage for the column, a Z-Stage for vertically moving in the Z-direction for holding the workpiece which is typically an integrated circuit from which the backside of the die is exposed, mechanically thinned, and polished. There is also a light microscope, concentric with the FIB column, which can operate in the infra-red for observing the etching process. In addition, the FIB column has an associated FIB imaging subsystem which detects secondary electrons ejected by the workpiece and provides a visual display of the resulting image for use by the operator. Hence, not only does this system provide an optical (e.g., infra-red) image, it also provides an electronic FIB image. Both of these images are displayed for the operator, typically on a video monitor.

For additional detail of such a system, see also U.S. Pat. No. 5,140,164, also referred to above. Tools based on the well-known FIB technology are in widespread use in the semiconductor industry and used, for instance, for integrated circuit editing, failure analysis and process monitoring. In terms of repair ("edits"), the repair is only to the metal interconnection layers overlying the actual integrated circuit semiconductor regions; hence, the repair is a circuit repair where "circuit" here refers to one or more of the various metal interconnection layers typically separated by layers of dielectric and overlying the actual crystalline substrate in an IC. The FIB mills (etches) a trench or hole or via, in this case through the IC substrate from the backside, so as to gain access to the metal layers. It is also known to use the FIB tool from the IC topside surface to directly access the metal layers, but this disclosure is not concerned with such an approach. Certain ICs must be accessed from the backside surface such as flip-chips. Flip-chip is a type of packaging for integrated circuits in which the top layer of the IC is covered with an array of bond pads and is then embedded in the packaging, making direct access to the buried conductors (metallization or circuitry as referred to here) difficult or impossible even with the unpackaged ICs from the IC principal surface. For flip-chip packaged devices which are to be accessed by FIB techniques, the electrical interconnections in the package itself cover the entire principal surface of the IC so there is no possibility of accessing the metallization from the top side (principal surface). Hence, access through the backside surface of the IC substrate is required.

Backside FIB access involves first removal of any heatsinking structure or other structures on the backside silicon surface and then the mechanical thinning and polishing of the silicon substrate to less than 100 microns, typically 50 micrometers (see, e.g., U.S. provisional application No. 60/275,760, incorporated herein by reference).

Hence, a method in accordance with this disclosure modifies the technique for forming a trench extending from the pre-thinned obverse (backside) silicon surface of the IC substrate most of the way through the substrate but leaving a thin layer of silicon remaining at the bottom of the trench between the bottom (floor) of the trench and the IC circuitry layer near the principal surface of the substrate itself. This allows relatively easy access thereinafter (e.g., by the focused ion beam) through the floor of the trench to the overlying metal layers.

Other aspects of this process are disclosed in patent application Ser. No. 10/160,606, entitled Method and Apparatus for Forming a Cavity in a Semiconductor Substrate Using a Charged Particle Beam, inventors Erwan Le Roy and Mark Thompson, both incorporated herein by reference in their entireties. These disclosures pertain to other improvements to FIB trenching for circuit modification. It is to be understood that the present method may be accomplished using the above described FIB tool in combination with an optical microscope as known in the field or modifications or improvements thereto.

The process disclosed here is exemplary. It involves etching a trench in a silicon semiconductor crystalline substrate which is part of a fabricated integrated circuit, using a focused ion beam with gallium ions. The integrated circuit has been prepared so that the packaging is removed at least on the backside surface (or perhaps the IC is not packaged) and the pre-thinned IC is conventionally mounted on a stage movable in the Z (vertical) direction. Typically, a distance of about 300 µm is maintained between the end of the chemistry injector and the working surface of the trench The chemistry injector is directed towards the area selected for FIB impact and enables several types of FIB assisted processes, including chemical enhanced etching. The FIB chemistry injector is positioned in Z through calibration with the ion beam focus when the ion beam focal point is on the working surface of the trench. The Z-stage on which the IC sample is mounted is frequently moved to maintain optical focus as the trench gets deeper. Use of infra-red wavelengths is known for throiughsilicon optical observations. Typically, the optical microscope has an associated infra-red light source, includes a bandpass filter admitting the infra-red wavelengths at 900 nanometers with a 70 nm bandwidth and a CCD camera. A typical current of the FIB is in the range of 10–15 nanoAmp. An exemplary original thickness of the silicon substrate is 40 µm. Of course, these parameters are merely exemplary.

Figure 1:
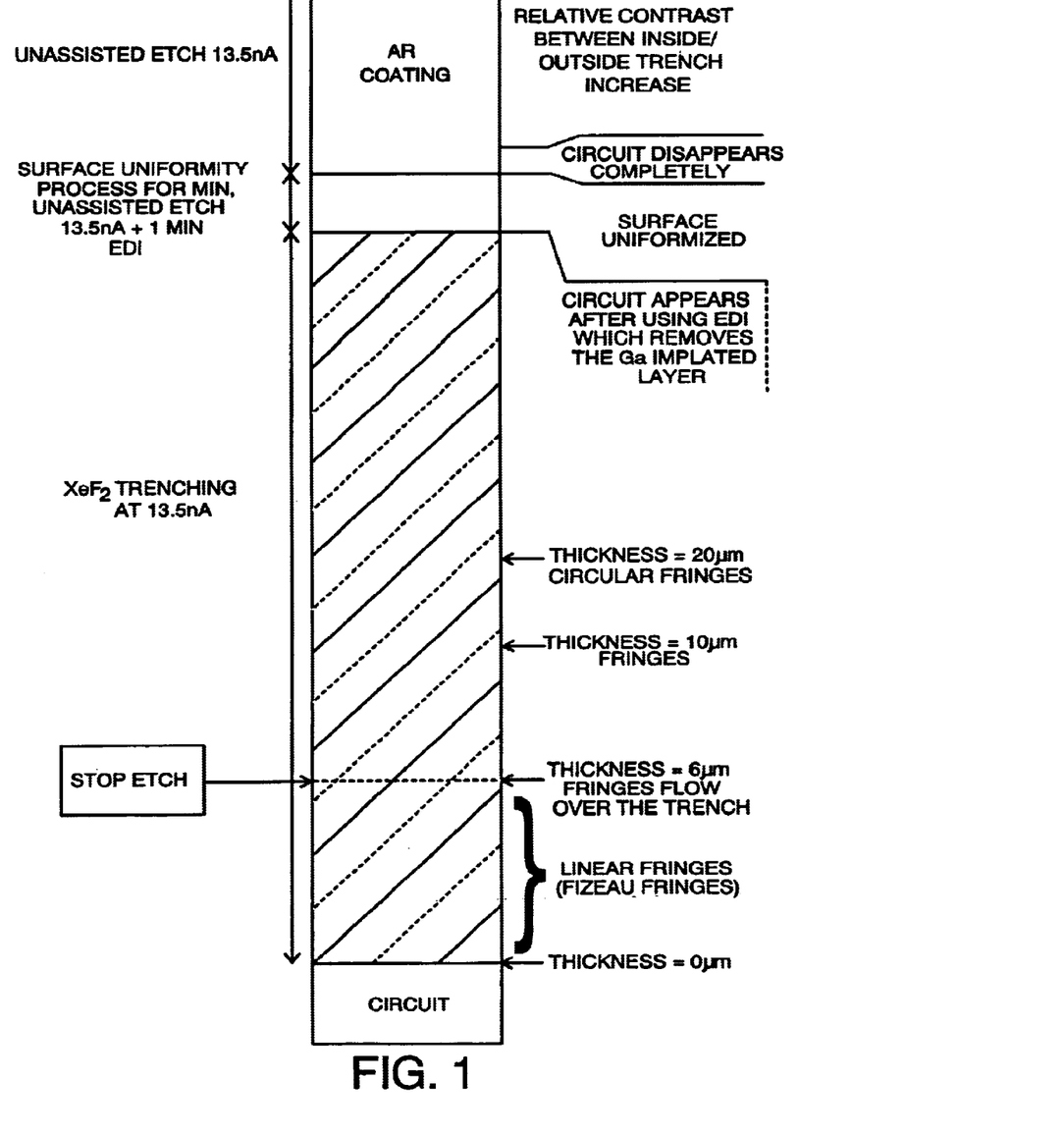
FIG. 1 shows graphically trench etching in accordance with this disclosure.

FIG. 1 therefore provides a graphical depiction of a trench etching process in cross-section accordance with this disclosure. The vertical axis represents both the cross-section of an IC and also the passage of time during the etching process which corresponds to various time points illustrated in the following figures.

The upper portion of FIG. 1 represents the silicon substrate surface of the IC (workpiece) and the bottom portion labeled "circuit" represents collectively the various circuitry layers. Prior to the depicted process of FIG. 1, the IC silicon substrate is first exposed by mechanical means. The entire backside surface of the thereby exposed IC die is then subject to lapping or milling and then polishing, using a conventional type machining tool of the type used in the semiconductor field, to render the entire backside surface as planar as possible. This planarity is with regard to the principal (front side) surface of the IC die.

Then an anti-reflection (AR) coating is conventionally applied on the exposed backside substrate surface. This coating is typically silicon oxide or hafnium dioxide. This AR coating is formed over the entire exposed backside surface and is provided in order to permit subsequent optical observations for device navigation using the optical microscope.

Then with the AR coating present, the operator, using the optical image, determines exactly where the trench is to be formed. The trench is typically rectangular in shape in plan view with a typical opening from 100×100 to 400×400 micrometers. Its size (length and width) and location are determined with reference to the known IC circuit layout and in accordance with the intended work to be carried out on the IC. The cross-sectional area of the focused ion beam is a very small circular area, typically in the range of 0.5 to 1 micrometer, much smaller than the typical size of the trench opening. Hence, the FIB is conventionally raster scanned over the surface area of the trench in order to perform the actual etching. This is all conventional. In FIG. 1, the first step then is local removal of the AR coating at the area where the trench is to be formed. This removal of the AR coating uses the process of unassisted FIB sputtering.

This exposes the actual (silicon) substrate surface. At this point, an unassisted (no injected chemistry gas) FIB etch is used to smooth the exposed substrate surface. It is intended to remove any surface defect initially present on the exposed substrate surface, generated in the initial thinning process. Thus if there are any local pits or scratches on the exposed surface, the entire area of the intended trench surface is reduced to the level of the bottom of such scratches or pits. The intention is to have the working substrate surface as smooth as possible. The typical FIB current here is in the range of 10 to 15 nanoAmps. Surface smoothing is monitored through the FIB and light optical images.

This unassisted FIB etching leaves a residual implanted ion layer at the exposed silicon surface due to the build-up of implanted incident ions (e.g., of gallium) from the FIB.

It is then necessary to remove this implanted layer. This is done, again using the FIB, with an injected "chemistry" gas which is, e.g., ethylene-di-iodide (EDI) (see U.S. Pat. No. 5,840,630 incorporated herein by reference in its entirety). A typical flow rate of the EDI results in a chamber pressure of about $2.0 \times 10^{-5}$ Torr.

As mentioned above, EDI is chosen as it is less aggressive in attacking the material (silicon) of the substrate than is the chemistry gas later used to rapidly etch the trench. Hence, these particular combinations of chemistry gases are exemplary. Also, there is no requirement that this first gas necessarily be less aggressive than the second gas used in forming the trench, but it has been found to be beneficial to do so because the first chemistry and not the second chemistry does not enhance etching at sharper angles such as defined by the defects and even seems to reduce the sharper angle milling by some process such as creating more mobile surface constituents or enabling the filling in of negative topography and leveling of the positive as has been discussed in the literature for other processes. This provides the desired smoothing, i.e., normalization. The optical microscope image is used to check the substrate surface for smoothness before the actual trenching step begins. The purpose of this step is to remove the implanted ion layer without actually attacking the underlying non-implanted silicon while maintaining the smooth substrate working face.

At each step, the substrate working face is observed both optically using the light optical microscope and, as desired, using FIB imaging. Further detail of what is observed by the operator is described below.

Note that due to the depth of focus of the optical microscope, any surface defect present in the working substrate face is easily observed by the operator. If there are any observed residual surface defects, these are removed by the FIB etching. The optical microscope image is used to check the substrate surface for smoothness before the actual trenching step begins.

Next, the actual conventional trenching is carried out using the FIB assisted with, e.g., conventional xenon-difluoride, again using a beam current of 13.5 nanoAmp. This proceeds as long as needed in order to achieve the desired remaining silicon thickness on the trench floor which typically extends to within 2–6 µm of the circuitry layer, that is just above the "circuit" in FIG. 1 as shown by the "stop etch" broken line.

The right hand column in FIG. 1 explains what is observed through the optical imaging tool, e.g., the infra-red microscope, to determine the trench floor thickness. This thickness corresponds to various times of trench etching as explained below. Silicon removal rate is fixed as per the beam current and the chemistry flow. With constant chemistry flow, the trenching rate therefore depends on the ion current and the area raster scanned (size of the trench opening). This rate is measured experimentally and can actually be done dynamically with the optical microscope as the trench progresses.

Figure 2:
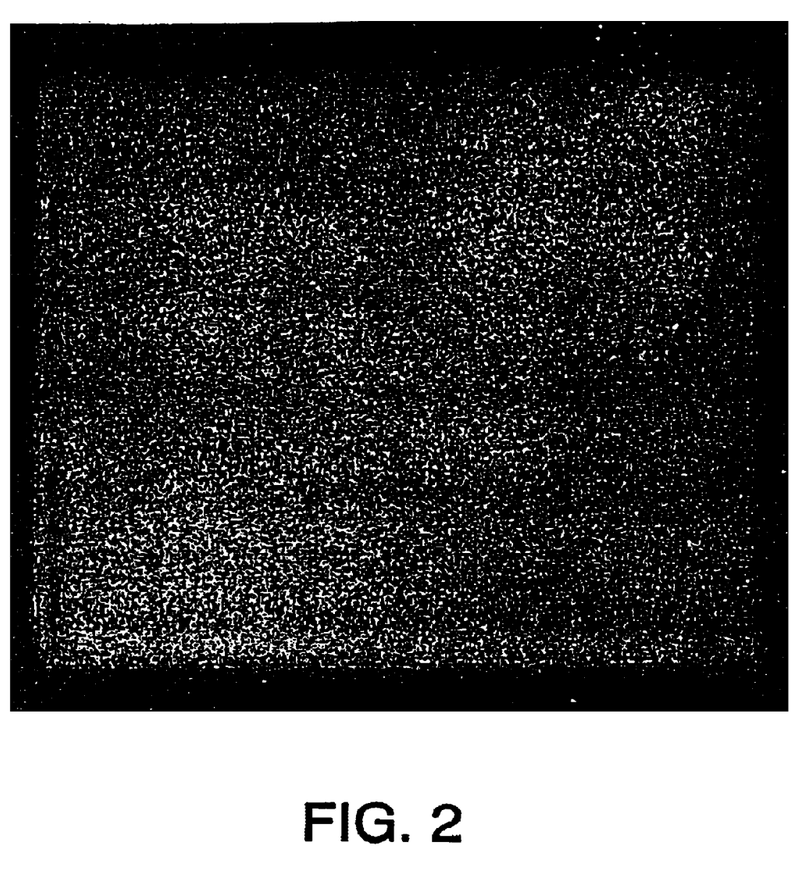
FIG. 2 shows an optical image at the beginning of the trench etching.

FIG. 2 shows the optical (infra-red) image of the trench (the trench being the lighter area surrounded by the darker anti-reflective area) just at the beginning of the xenonfluoride trench etching, designated here time=zero minutes. In this case a part of the circuit, is visible when the substrate at the trench floor has a thickness of 38 µm. The circuit portion is seen as a slightly darker rectangular area in the lower left hand portion and the reported structure on the left edge of the image of FIG. 2. At this point no interference fringes are apparent.

Figure 3A:
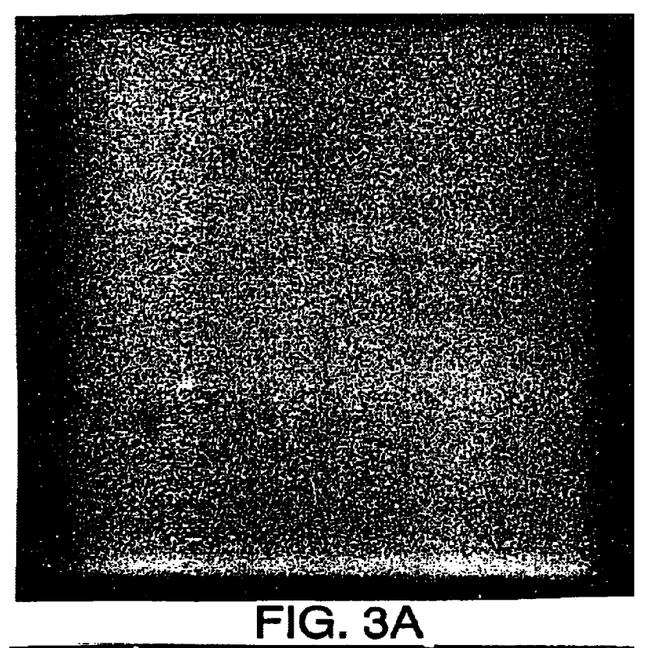
FIGS. 3A and 3B show optical images of further steps in the trench etching.
Figure 3B:
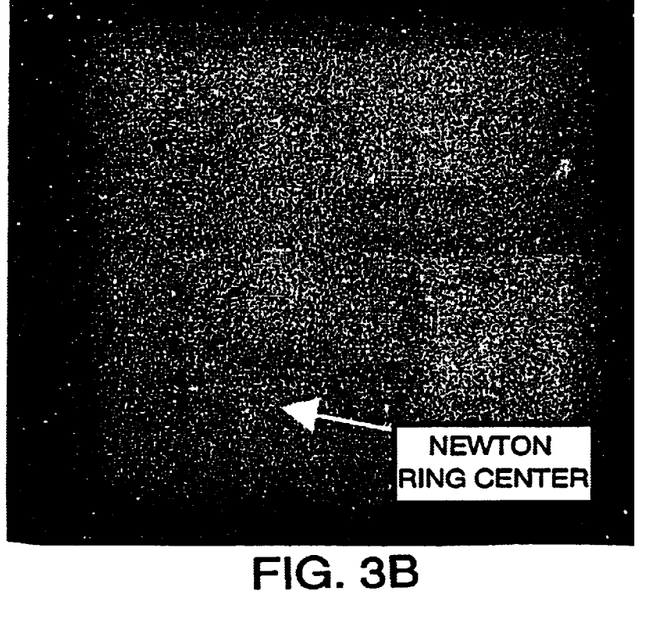

FIGS. 3A and 3B show further images for times respectively time 1 minute and 3 minutes. At this point the circuitry is visible in FIGS. 3A and 3B as being somewhat darker and hence more visible.

Figure 4A:
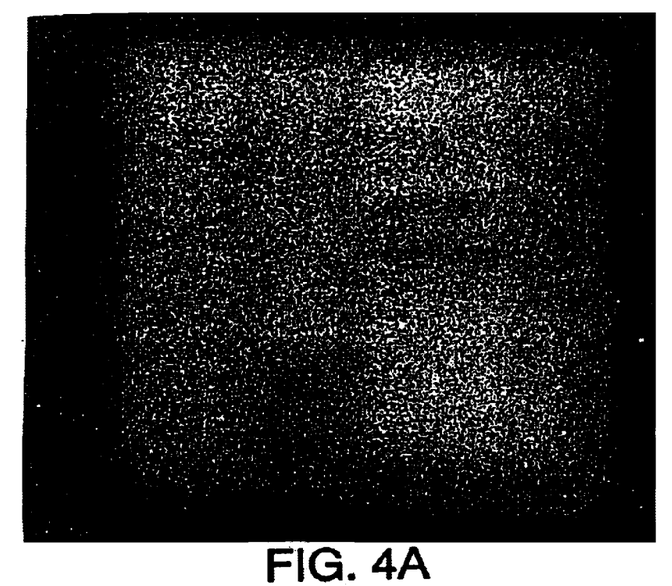
FIGS. 4A and 4B show trench etching showing Newton rings.
Figure 4B:
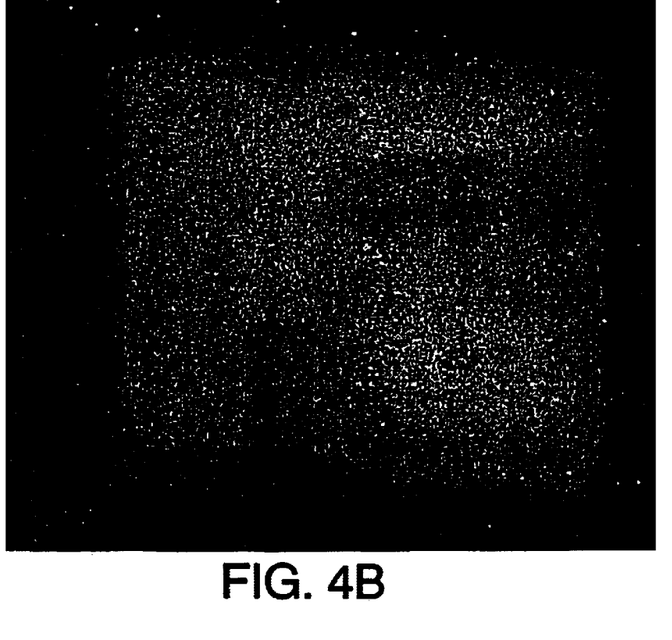

At the subsequent time of 4 minutes of trench etching in FIG. 4A, position is identical to that of FIG. 3B, as it also is in FIG. 4B at time equals 5 minutes. FIG. 4B is just beginning to show fringes although with very weak contrast. Note that these figures are effectively depictions of the trench floor.

Figure 5A:
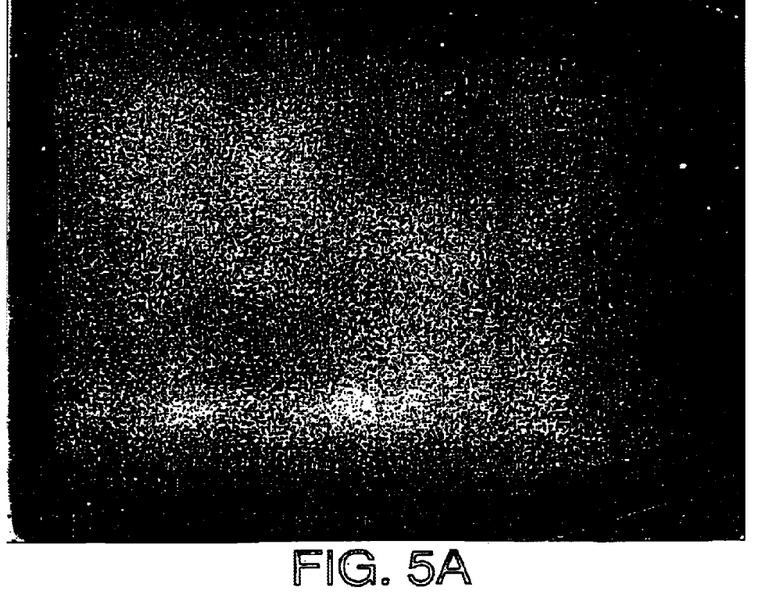
FIGS. 5A and 5B show additional Newton rings later in the trench etching.
Figure 5B:
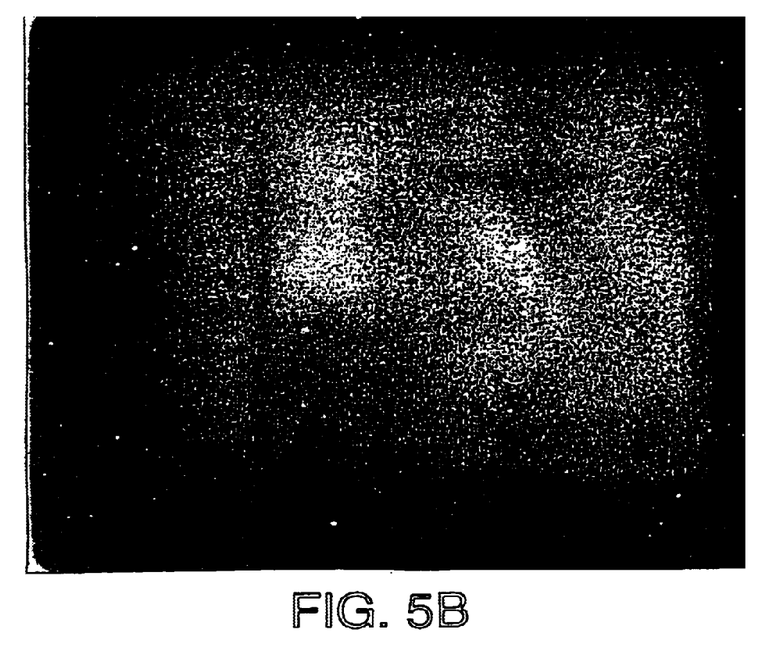

At subsequent FIG. 5A, at time equals 6 minutes, the interference fringe contrast is higher. At subsequent FIG. 5B, at time equals 7 minutes, the interference fringes become denser at the lower part of the image, which indicates a wedge to the trench floor.

Figure 6A:
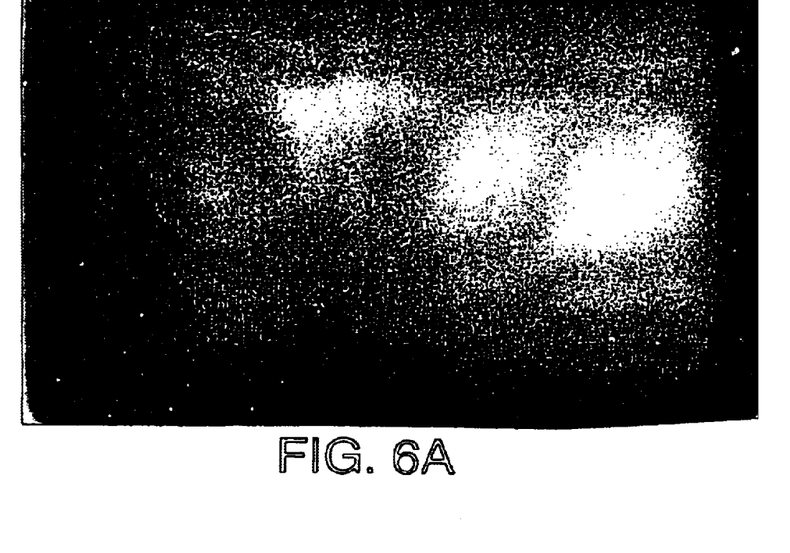
FIGS. 6A and 6B show changes in interference fringes in accordance with this disclosure later in the trench etching.
Figure 6B:
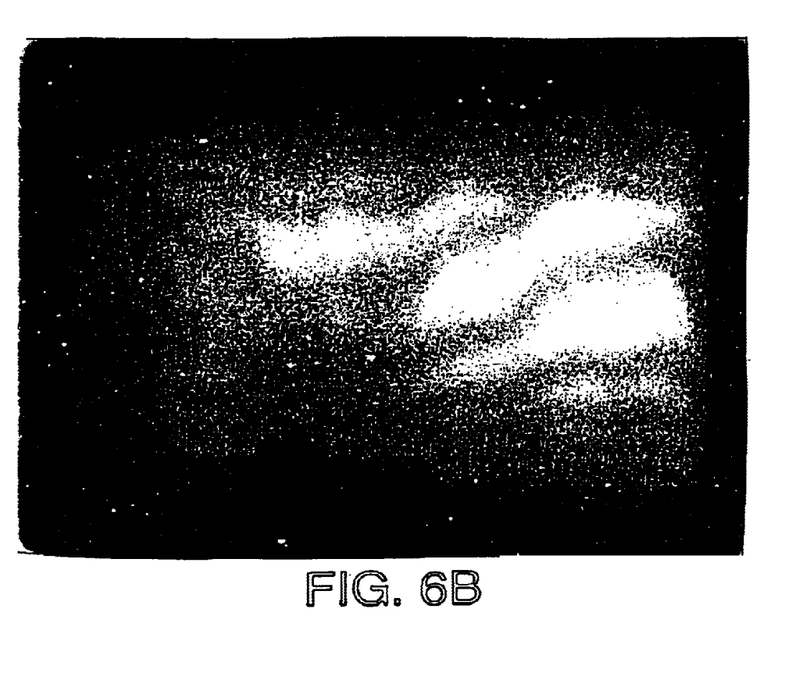

At subsequent FIG. 6A, at time equals 8 minutes, there is approximately only 6 µm of silicon thickness left at the trench floor. At this point the interference fringes transition in shape at the middle of the trench floor from circular to linear. Thirty seconds later, at time equals 8½ minutes at FIG. 6B, the fringes are more markedly linear and denser. In this case the fringe contrast is quite high so the fringes are quite visible.

Figure 7A:
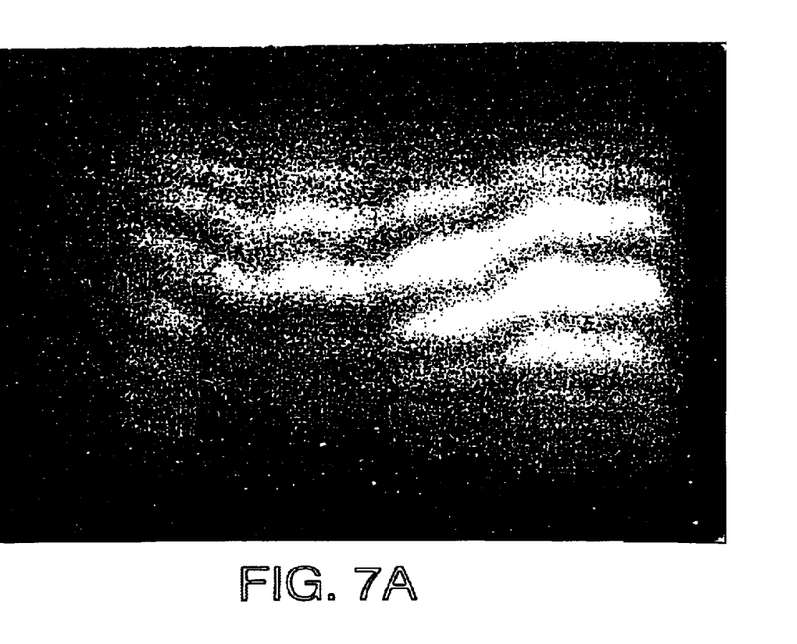
FIGS. 7A and 7B show additional changes in Fizeau fringes later yet in the trench etching.
Figure 7B:
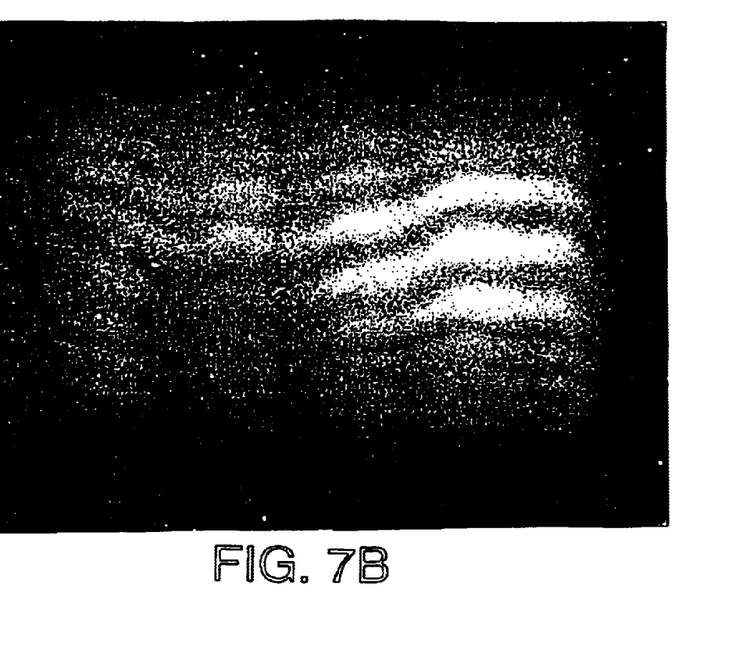

At subsequent time equals 9 minutes, at FIG. 7A, the fringes have a decreased distance between adjacent fringes. At FIG. 7B, which is just 17 seconds after FIG. 7A, the Fizeau fringe contrast is already decreasing.

Figure 8A:
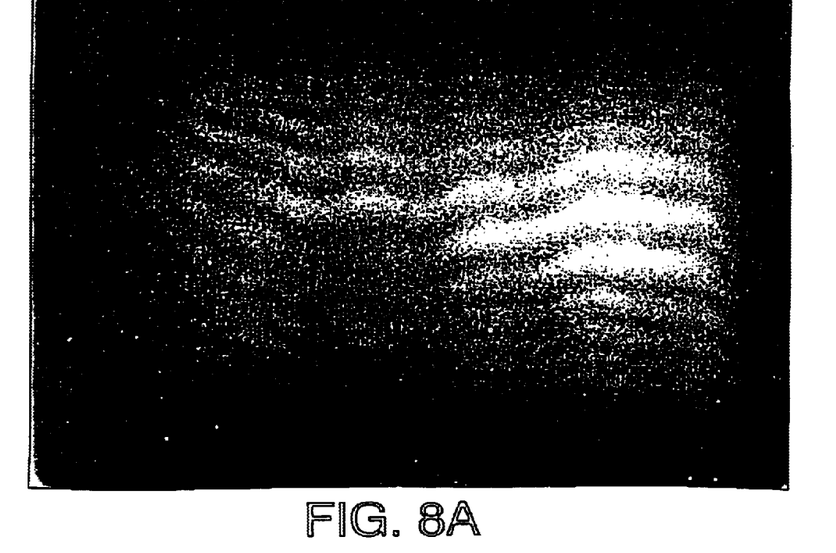
FIGS. 8A and 8B show how the circuit becomes visible in the interference fringes.
Figure 8B:
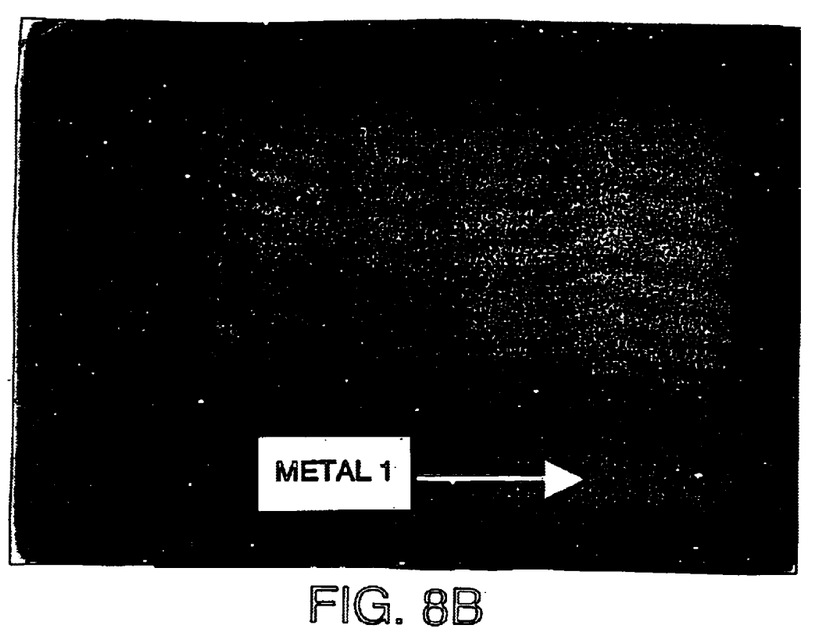

At FIG. 8A, at time equals 9.5 minutes, the fringes are still visible. At subsequent FIG. 8B, at time equals 9 minutes 55 seconds, the circuitry metal layer is again visible, here designated metal 1.

Figure 9:
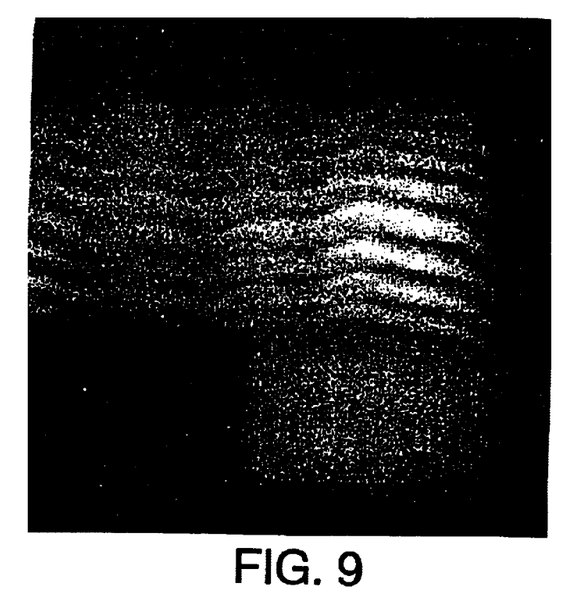
FIG. 9 shows how contrast of interference fringes increases later in the trench etching.

At subsequent FIG. 9, the fringe contrast increases at time equals 10 minutes 5 seconds. This is effectively the end of the trench etching since the trench has now reached its intended remaining silicon thickness.

Figure 10:
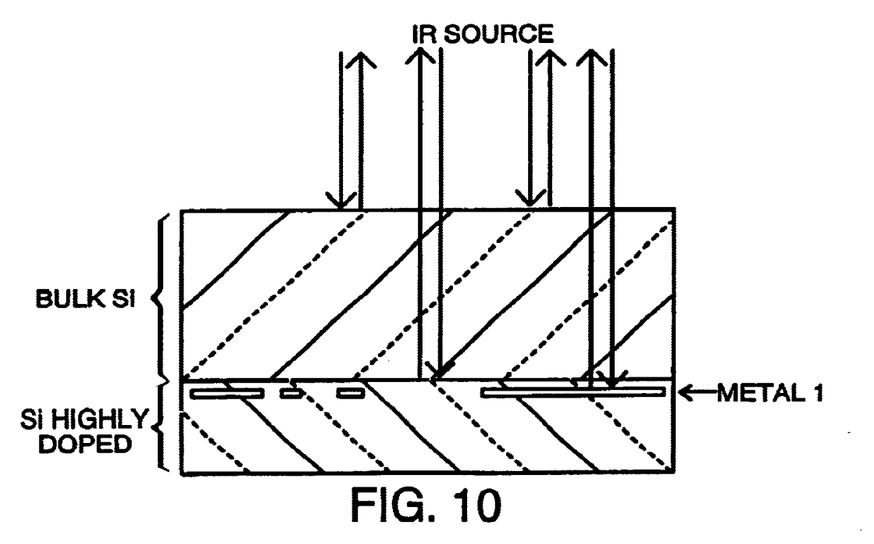
FIG. 10 shows a cross section of the semiconductor device showing how the fringes are generated optically.

FIG. 10 shows diagrammatically how the interference fringes are generated. FIG. 10 shows a cross section of the integrated circuit substrate including the bulk silicon (Si) portion, the upper surface of which is the backside surface of the substrate, and at the lower part of the drawing, the semiconductor highly doped diffusion region with the overlying dielectric layers, and in this case a single layer of metal interconnect circuitry in the dielectric layer. The lighter area represents the silicon and the darker portion the overlying circuit portions including the metal layer. Hence, when this structure is illuminated by infra-red light from an infra-red light source as shown, interference happens between the light reflected from the silicon and the light reflected from the circuitry.

Figure 11:
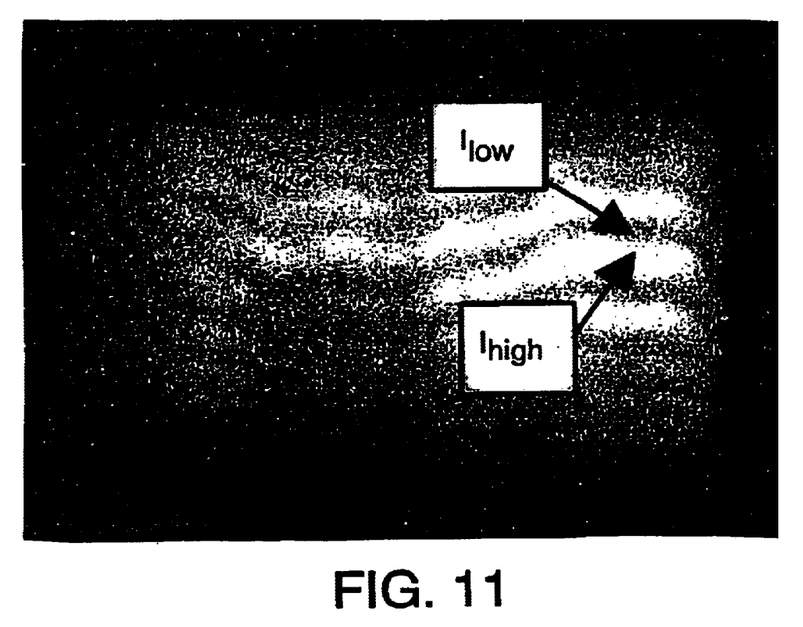
FIG. 11 shows relative contrast of interference fringes during trench etching.
Figure 12:
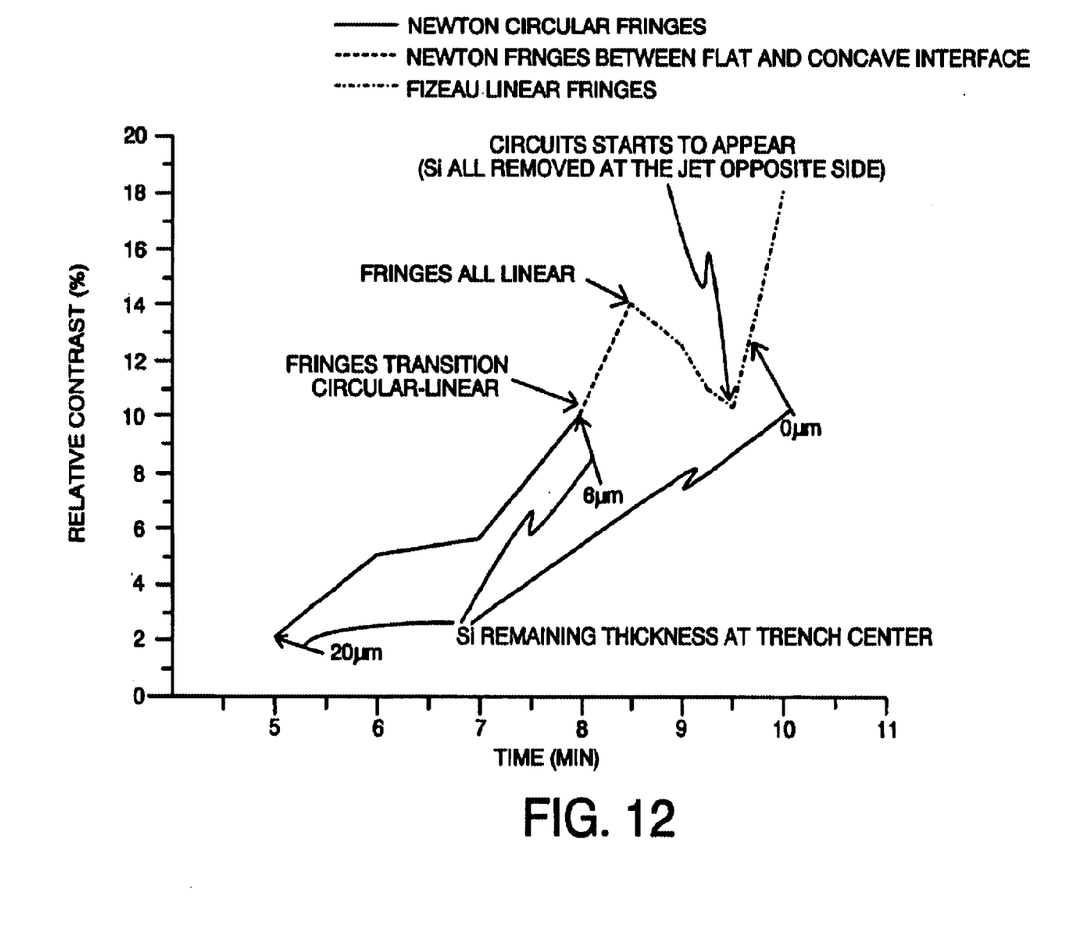
FIG. 12 shows a graph relating to FIG. 11.

One issue is that with the typical FIB system, due to resulting directionality of the chemistry assist gas delivery of the FIB chemistry gas injector, the actual thickness profile of the trench floor is related to the assist chemistry gas flow as the depth of the trench increases. Hence, the resulting trench floor may not be flat. One technique used here to analyze the interference fringes uses a relative contrast measurement on adjacent fringes at the same location. As shown in FIG. 11, there is a high intensity ($I_{high}$) portion of each fringe and an adjacent low intensity ($I_{low}$) portion of that fringe, in terms of brightness. The relative contrast is the high brightness minus low brightness divided by the sum of the high and low brightnesses. This relative contrast analysis is plotted in the graph of FIG. 12 which shows along the horizontal axis the etching times and on the vertical axis the relative fringe contrast, as indicated in the key. As shown, the relative contrast between fringes is dependent on the etching time, that is, the thickness of the trench floor. The indicated 20 µm, 6 µm, 0 µm in FIG. 12 refer to the remaining silicon thickness at the trench floor, in the trench center. FIG. 12 indicates that fringe contrast is an increasing function as floor thickness decreases. Hence, one can be predict from the graph the remaining silicon thickness at the trench floor from the observed relative contrast of the fringes. Thereby, one determines the end point of the etching by the observed contrast of the fringes. Thus, the thickness of the silicon material at the floor of the trench is determined (endpointed) and one can thus determine how long the etching should take place. Note that this analysis is dependent upon the material of the circuitry layer, the particular semiconductor substrate material such as silicon or gallium arsenide, the semiconductor doping levels, the illumination light coherency and the optical lenses used. The graph FIG. 12 can be plotted manually or by conventional computer software using the observed fringe intensities as measured by a video camera coupled to the infra-red microscope and suitable conventional image processing computer software.

FIGS. 13A, 13B are block diagrams of an apparatus useful to carry out the above method.

FIG. 13A shows in cross-section an apparatus used to carry out the above method. It is to be understood that the above method generally uses the understanding gained by the operator from observation of both the FIB image and the optical image to determine when each step in the etching process should be terminated. The FIG. 13A apparatus (which here is the commercially available IDS OptiFIB™ from Schlumberger) includes a conventional FIB column 30 having the ion source 32 and accelerating and focussing electrodes 38 and FIB imaging system (scintillator detector) 42. The ion beam 34 passes through the column 30. The column 30 is moved in the X and Y directions as indicated by the arrows by a precision XY stage 40. A sliding seal 48 is provided between the ion beam column 30 and the sample chamber 33. The sliding seal 48 provides the necessary environmental protection since the interiors of the chamber 33 and column 30 are typically at vacuum. Also provided is the FIB gas injection system which has conventional elements including reservoirs, piping and valves 50 and which terminates at the gas injector tip 68. The optical imaging system includes an optical fiber 52 which introduces the light which is then reflected (as free space light) after entering the column 30 by mirrors 54 and 56 and 58 down through the photon-ion objective lens 60. The ion beam and light beam are incident on the device under test (DUT) 66 which rides on a Z (vertical movement) stage 64. Stage 64 brings the device under test 66 (typically an integrated circuit) to the focus plane of the light optics. A typical distance between the tip of the photon-ion objective lens 60 and the top surface of the device under test 66 is 14 mm. The gas injection system 50 and the scintillation detector 42 are in the same subsystem as is the column 30 so as to be fixed relative to the ion beam and light beam axes.

FIG. 13B shows details of the optical imaging system of FIG. 13A. Elements in FIG. 13B which are the same as in FIG. 13A have the same reference numbers. Additional detail shown in FIG. 13B includes the light diffuser 70, light filter 72, lens 74, and beam splitter 78. Also shown is the optical objective lens 64 and a second optical lens 80. The optical imaging for the user is captured by a charge coupled device (CCD) 86 which receives the light reflected back up from the device under test 66 via mirrors 58, 56, and 54 and back through beam splitter 78. The charge coupled device 86 is typically connected electrically to a computer to provide the optical image on a conventional computer monitor.

This disclosure is illustrative and not limiting. Further modifications will be apparent to one skilled in the art in light of this disclosure, and these modifications are intended to fall within the scope of the appended claims.

We claim:

1. A method for determining the thickness of the trench floor etched by chemical assisted FIB milling into the obverse silicon surface, the method comprising the instead steps of:

directing a light beam into the cavity from the obverse surface;

observing any fringes resulting from the light beam interference between reflections from the silicon surface (trench floor) and circuitry underneath; and determining a thickness of the silicon substrate between a bottom of the cavity and the circuitry layers that reflect the light.

2. The method of claim 1, wherein the interference fringes are at least one of Newton fringes and Fizeau fringes.

3. The method of claim 1, wherein the light beam is infra-red light.

4. The method of claim 1, wherein the step of observing includes finding no interference fringes, and the act of determining thereby results in a determined thickness of at least 38 $\mu$m.

5. The method of claim 1, further comprising the step of determining a configuration of the bottom of the cavity from the observed fringes.

6. The method of claim 1, wherein the step of determining comprises determining one of a relative contrast of the fringes.

\* \* \* \* \*